United States Patent [19]

Gans et al.

[11] Patent Number: 4,689,631
[45] Date of Patent: Aug. 25, 1987

[54] SPACE AMPLIFIER

[75] Inventors: Michael J. Gans, Monmouth Beach; Martin V. Schneider, Holmdel; Ralph F. Trambarulo, Red Bank, all of N.J.

[73] Assignee: American Telephone and Telegraph Company, AT&T Bell Laboratories, Murray Hill, N.J.

[21] Appl. No.: 738,437

[22] Filed: May 28, 1985

[51] Int. Cl.$^4$ ............... H01Q 15/14; H01Q 13/02; H01Q 13/06
[52] U.S. Cl. ............... 343/781 R; 342/376; 343/775; 343/777; 343/781 P; 343/908
[58] Field of Search ........... 343/772, 774–779, 343/781 R, 753, 754, 781 P, 753–755, 773, 781 CA, 832–840, 912–914, 908; 342/350, 353, 368–376, 428–429

[56] References Cited

U.S. PATENT DOCUMENTS

| | | | |
|---|---|---|---|
| 2,206,923 | 7/1940 | Southworth | 343/777 X |
| 3,049,708 | 8/1962 | Berkowitz | 343/753 X |
| 3,631,503 | 12/1971 | Tang et al. | 343/754 |
| 3,835,469 | 9/1974 | Chen et al. | 343/754 |
| 3,989,994 | 11/1976 | Brown | 321/1.5 |
| 4,058,812 | 11/1977 | Stanislaw | 343/781 P X |
| 4,150,382 | 4/1979 | King | 343/754 |
| 4,388,626 | 6/1983 | Gans | 343/854 |
| 4,415,901 | 11/1983 | Gans | 343/754 |
| 4,607,259 | 8/1986 | Dragone | 343/778 |

OTHER PUBLICATIONS

Leopold et al., NTC '80, 11/30–12/4, 1980, Houston, Tex., pp. 72.1.1–72.1.5.
Leahy, Proc. 1983 IEEE Mil. Comm. Conf., vol. 2, Oct. 31–Nov. 2, 1983 at pp. 383–385.
Watkins, 1983 IEEE MTT-S International Microwave Symp., May 31–Jun. 3, 1983, Boston, Mass., pp. 145–147.

Primary Examiner—Marvin L. Nussbaum
Attorney, Agent, or Firm—Erwin W. Pfeifle

[57] ABSTRACT

The present invention relates to a high-power solid state amplifier arrangement comprising a large number of solid state amplifiers disposed in a waveguide array. The waveguide array is disposed in the aperture of an antenna feed arrangement at the image plane of an antenna feed to receive a uniform distribution over the array with substantially no spillover. Each of the large number of parallel waveguide sections of the array includes one or more solid state amplifiers in a serial, waveguide-interconnected, arrangement, and a wideband impedance matching arrangement in the waveguide configuration at the input and output of the section.

9 Claims, 7 Drawing Figures

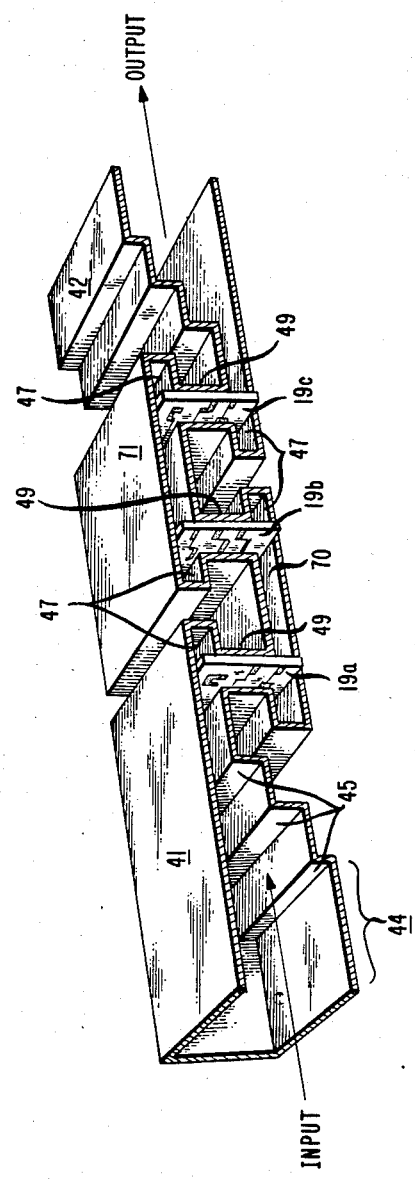

SPACE AMPLIFIER

The Government has rights in this invention pursuant to Contract No. F33657-84-C-3716.

TECHNICAL FIELD

The present invention relates to a high-power solid state space amplifier including a waveguide array comprising a large number of solid state amplifiers. More particularly, the amplifier array is disposed at the aperture of an antenna and at the image surface of the feed, or feed array, of the antenna to achieve a uniform distribution over the array with substantially no spillover.

DESCRIPTION OF THE PRIOR ART

Amplification is used in various systems to increase the power of a signal being transmitted to a remote location in a satellite or terrestrial microwave system. One type of system known in the prior art is a space oriented microwave power transmission system as disclosed in U. S. Pat. No. 3,989,994 issued to W. C. Brown on Nov. 2, 1976. There, a combined active phased antenna array for a solar power station includes a plurality of directly coupled microwave energy generators for conversion of the dc power generated by a system of solar energy conversion means into microwave energy for transmission back to the Earth. In such arrangement, a low powered beam is received from a ground station and redirected after amplification back to the ground station. A similar arrangement using solid state designs for the amplifiers is disclosed in the article by L. Leopold in *NTC '80*, 30 Nov.–4 Dec. 1980, Houston, Texas at pages 72.1.1–72.1.5.

U.S. Pat. No. 4,415,901 issued to M. J. Gans et al on Nov. 15, 1983 relates to a low power beam switchable antenna arrangement comprising an amplifying array in the aperture of a main reflector at the fourier transform surface of the scannable feed array. This arrangement permits the signal radiated in a predetermined direction from the feed array to be appropriately amplified at the aperture of the antenna and reradiated with a relative phase shift equal to that of the beam radiated by the feed array. Another arrangement including an array in the aperture of the antenna for providing an antenna with a reduced number of phase shifters with potential amplification is disclosed in U.S. Pat. No. 4,388,626 issued to M. J. Gans.

Generally, when high power with amplification is required, devices such as traveling-wave tubes and other similar devices have been used, because such single device can provide sufficient amplification with the required high power. When solid state devices have been considered (e.g., for reasons of reliability, light weight, and/or low voltage power supplies) for high-power amplification, many such devices in an array are required to provide the needed power output. The problem with forming such an array is that a divider network is needed to apply the input signal to all of the solid state devices needed. Such dividers, however, are inefficient to the extent much of the power gained by the amplifier array is lost in the divider network. A similar loss is found in a reverse direction where the amplifier array requires a combiner. The problem in the prior art is to provide a technique which includes a solid state amplifier array that avoids to loss of power found with an associated divider or combiner.

SUMMARY OF THE INVENTION

The foregoing problem in the prior art has been solved in accordance with the present invention which relates to a high-power solid state space amplifier comprising a large number of solid state amplifiers disposed in a waveguide array. The waveguide array is disposed in the aperture of an antenna arrangement at the image plane of the antenna feed to receive a uniform distribution over the array with substantially no spillover.

It is an aspect of the present invention to provide a high-power solid state space amplifier comprising an array of a large number of solid state amplifiers, each array section including an arrangement of one or more waveguide mounted amplifiers which provides waveguide-to-amplifier wideband matching and waveguide filtering to prevent feedback.

Other and further aspects of the present invention will become apparent during the course of the following description and by reference to the accompanying drawings.

BRIEF DESCRIPTION OF THE DRAWINGS

Referring now to the drawings in which like numerals represent like parts in the several views:

FIG. 7 is a cross-sectional view in perspective of one section of the waveguide array for mounting three solid state amplifiers in a serial fashion to provide high-power amplification, wideband matching, and feedback filtering.

DETAILED DESCRIPTION

Figure 1:
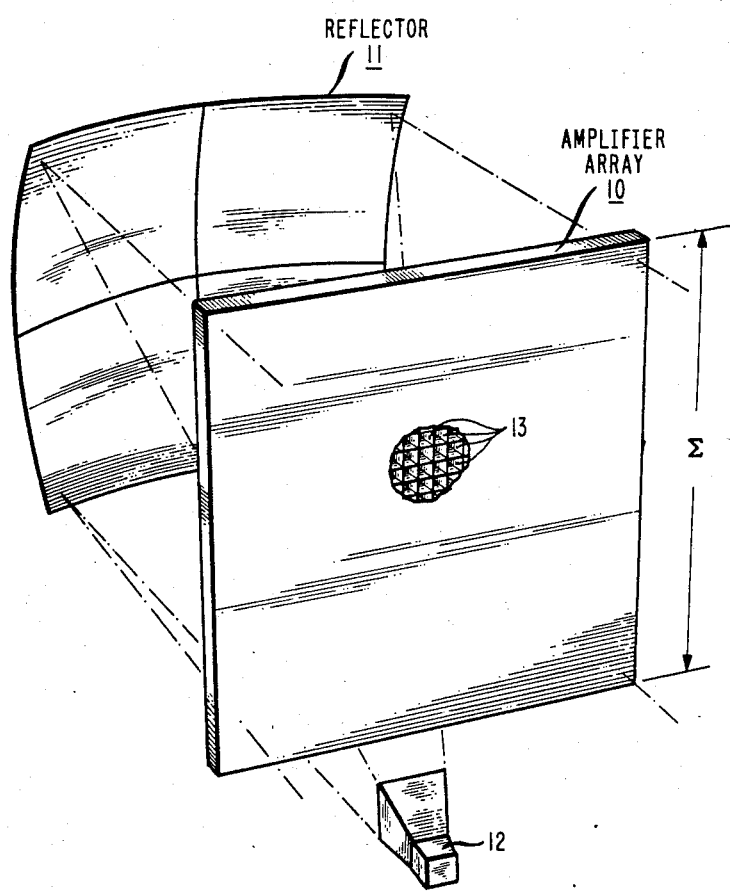
FIG. 1 is a view in perspective of an antenna arrangement comprising a single feed and an amplifier array in accordance with the present invention.
Figure 2:
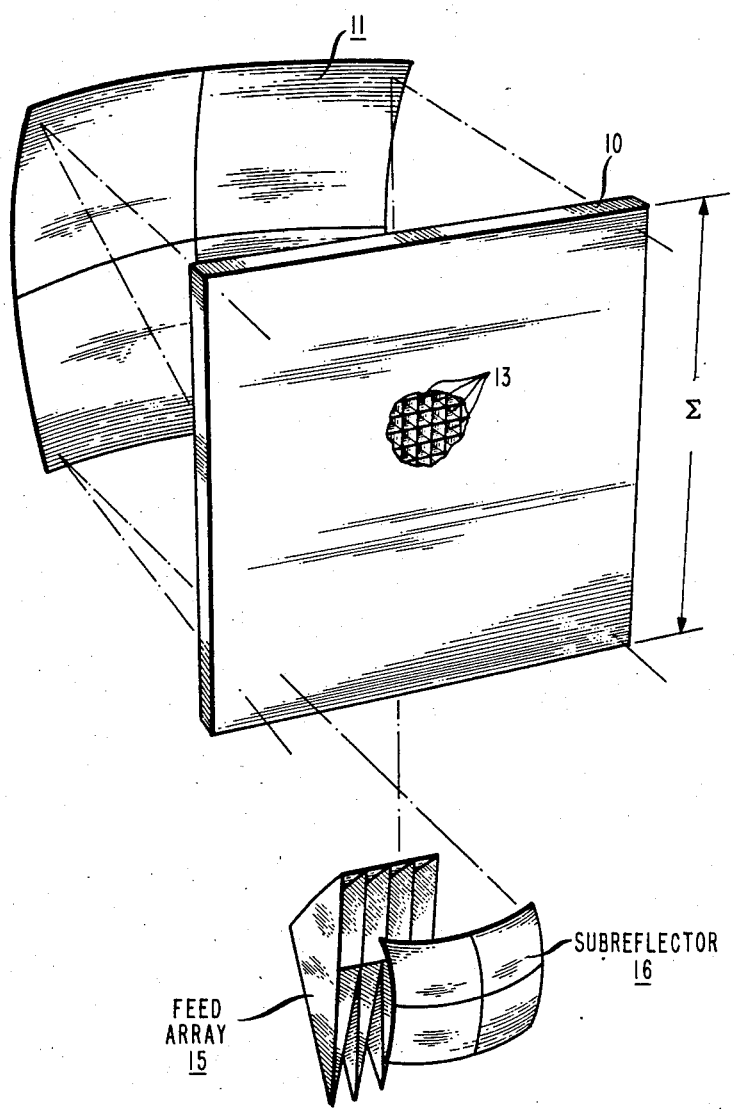
FIG. 2 is a view in perspective of an alternative arrangement to the arrangement of FIG. 1 for including a linear feed array for the feed of FIG. 1.

FIG. 1 illustrates a solid state amplifier arrangement in accordance with the present invention comprising a solid state amplifier array 10 which is preferably disposed in the aperture of a reflector 11 of an antenna arrangement to achieve uniform distribution of an input signal to each amplifier of the array without the need for divider circuitry. The antenna arrangement of FIG. 1 includes a single feedhorn 12 which illuminates reflector 11. The amplifier array is disposed such that at least a predetermined axis of amplifier array 10 is located on an image plane $\Sigma$ of feedhorn 12 with the amplifier array substantially covering the image of the aperture of the feedhorn. The amplifier array 10 comprises a plurality of waveguides 13 disposed adjacent each other as shown in a small section thereof in FIG. 1. Within the plural waveguides 13, are mounted a same plurality, or more, of solid state amplifiers as will be described in greater detail hereinafter. It is to be understood that the present amplifier arrangement could also be achieved using a linear or two-dimensional feed array 15 and an associated subreflector 16 as shown in FIG. 2, and that the wavefront impinging amplifier array 10 in FIGS. 1 or 2 can be a planar wavefront, a spherical wavefront or any other form of wavefront. It is to be further understood that the discussion hereinafter is related only to a transmitting arrangement for purposes of avoiding circuitry for distributing an input signal to each of the amplifiers of an amplifier array 10, but that the present arrangement could also be applicable to a receiving arrangement for avoiding a means for combining the signals amplified by the amplifiers of array 10.

Figure 3:
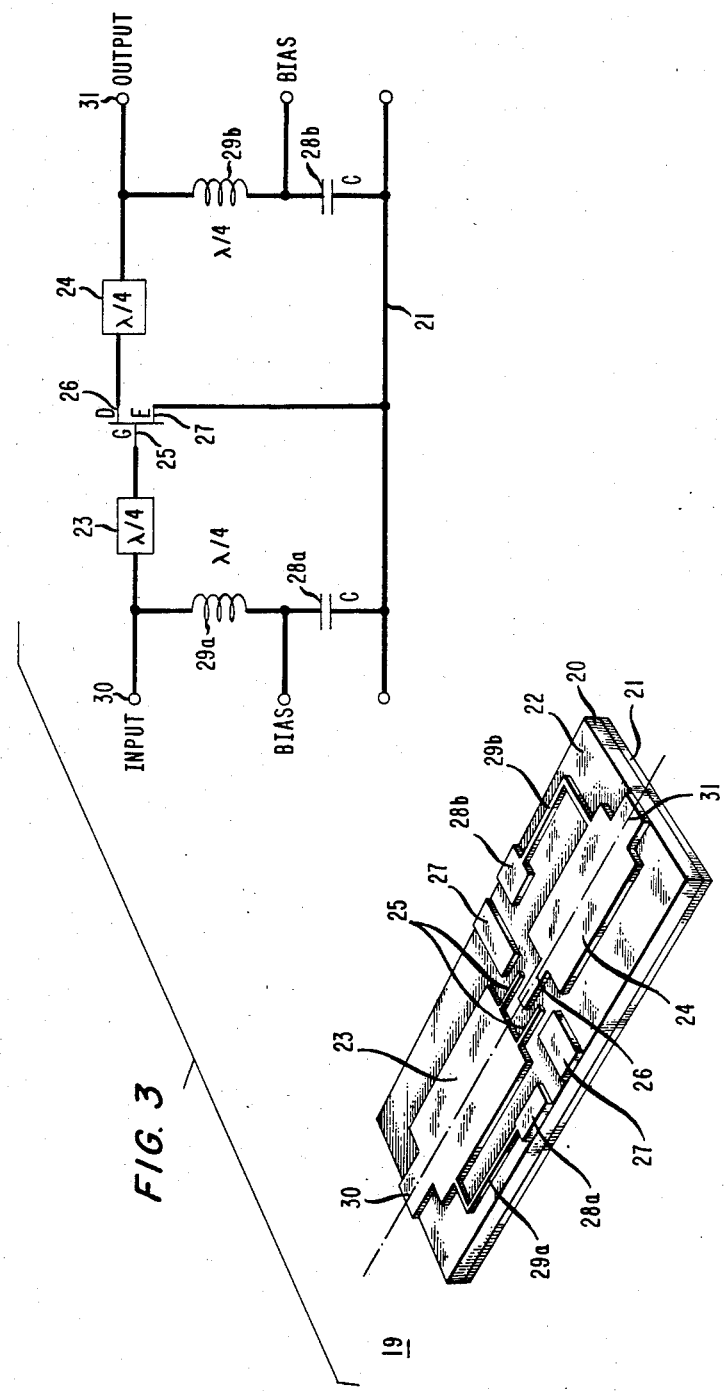
FIG. 3 is an exemplary arrangement of a solid state amplifier and equivalent circuit for use in the amplifier array of FIGS. 1 or 2.

FIG. 3 illustrates an exemplary arrangement for a solid state amplifier 19 for use in the amplifier array 10 of FIGS. 1 or 2. More particularly, the solid state amplifier arrangement 19 comprises a substrate 20 with a ground plane 21 disposed on a first major surface of substrate 20. A pattern of conductive material is disposed on the second major surface 22 of substrate 20 comprising a first and second microstrip line 23 and 24, respectively. The Field Effect Transistor (FET) formed on substrate 20 includes a "GATE" formed by the two spaced-apart projections 25 from the end of first microstrip line 23; the "DRAIN" is formed by the projection 26 from the end of second microstrip line 24, which projection is disposed between projections 25; and the "SOURCE" is formed from the pads 27 projecting from opposing edges towards the GATE projections 25.

Figure 4:
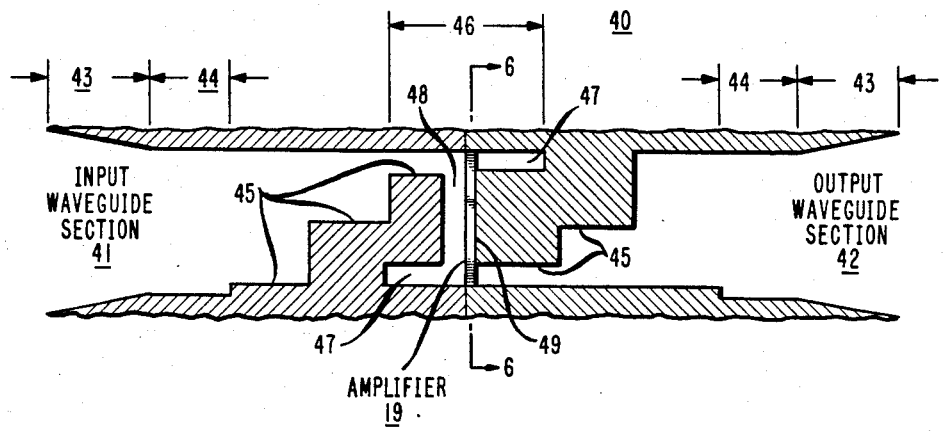
FIG. 4 is a cross-sectional view of one section of the amplifier array of FIGS. 1 or 2 showing the mounting of a solid state amplifier between an input and output waveguide horn in accordance with the present invention.

Appropriate biasing is provided to the FET via bias pads 28a and 28b which are connected to the first and second microstrip lines 23 and 24, respectively, by respective leads 29a and 29b. Leads 29a and 29b are thin leads for preventing radio frequencies (RF) from leaking out to power supplies while allowing the dc to appropriately bias the FET. The ends of microstrip lines 23 and 24 are terminated at the edge of substrate 20 by a narrowed section 30 and 31 to form an input and output probe, respectively, to the amplifier when the arrangement is mounted within a waveguide. It is to be understood that narrowed section 30 and 31 can also be terminated adjacent to, but not directly at, the ends of substrate 22 to form the probes. It is preferable that microstrip lines 23 and 24 and leads 29a and 29b be a quarter wavelength long. An equivalent circuit diagram is also provided in FIG. 3 with the various circuit components being designated corresponding numbers to the components on substrate 20. It is to be understood that the amplifier arrangement 19 of FIG. 3 is shown for purposes of exposition only and not for purposes of limitation since any suitable amplifier arrangement could be substituted therefor. For example, a similar solid state amplifier arrangement is shown in FIGS. 1 and 4 of the article "A 60 GHz GaAs FET Amplifier" by E. T. Watkins et al in 1983 *IEEE MTT-S Digest*, May 31–June 3, 1983, Boston Mass., at pages 145–147.

Each amplifier arrangement 19 of FIG. 3 is preferably mounted in waveguide array 10 in the manner shown in FIG. 4. More particularly, each waveguide section 40 forming a part of amplifier array 10 comprises a hollow input waveguide section 41 and a hollow output waveguide section 42. The input waveguide section 41 preferably comprises a horn section 43 which is tapered inwards from the aperture thereof to a short parallel-walled section 44. Steps 45, in input waveguide section 41, end in a reduced-height waveguide section 46 to provide a wideband impedance matching arrangement between the aperture of input waveguide section 41 and amplifier arrangement 19. A short approximately quarter-wavelength section 47 of the reduced-height waveguide section 46 extends beyond amplifier arrangement 19 to avoid reflection as is well known in the art. An output waveguide section 42 is a reverse arrangement of input waveguide section 41 and includes a reduced-height waveguide section 46 with shorting section 47, steps 45, parallel-walled section 44 and horn section 43. The amplifier arrangement 19 is mounted in a cavity 48 between the reduced-height waveguide sections 46 of input and output waveguides sections 41 and 42 with its ground plane 21 in electrical contact with waveguide wall 49. It is to be understood that the mounting of amplifier arrangement 19 in cavity 48 is for purposes of exposition only and that any other mounting arrangement can be used which allows the probes 30 and 31 to be extended into waveguide sections 46 and provides appropriate biasing to the amplifier.

Figure 5:
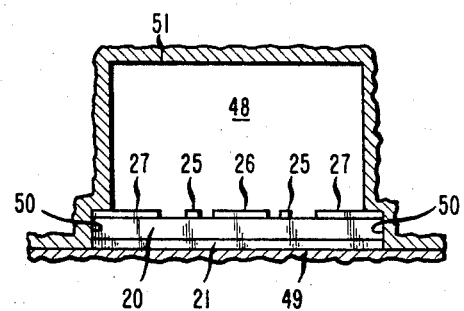
FIG. 5 is a cross-sectional view of the amplifier arrangement of FIG. 3 as mounted in the cavity 48 of the waveguide section of FIG. 4.

FIG. 5 is a cross-sectional view across the center of amplifier arrangement 19 of FIG. 3 at source pads 27 as mounted within cavity 48 of FIG. 4. As seen in FIG. 5, amplifier arrangement 19 of FIG. 3 is mounted along its long edges within grooves 50 formed in two of the adjacent corners of cavity 48. Additionally, ground plane 21 is positioned in electrical contact with waveguide wall 49 while source pads 27 are positioned in electrical contact with the edges of grooves 50. Since the wall 51 forming cavity 48 is mated with waveguide wall 49 to provide an electrical contact therebetween, by mounting amplifier 19 as described, source pads 27 are electrically connected to ground plane 21 via walls 49 and 51 when amplifier 19 is secured in place in grooves 50.

Figure 6:
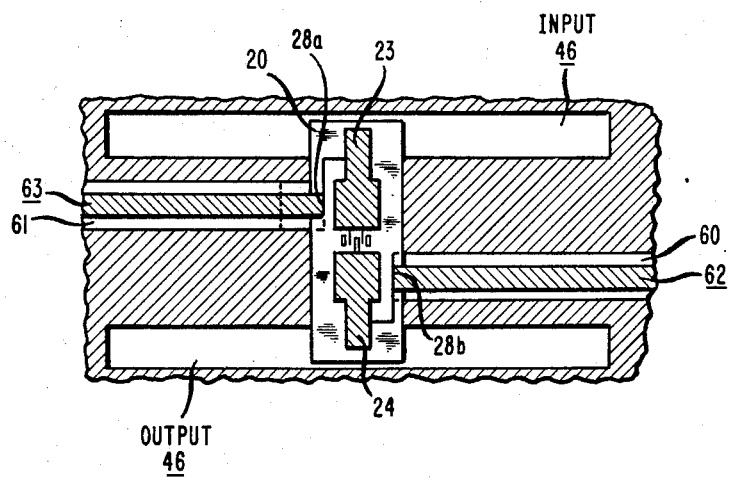
FIG. 6 is a view through section 6—6 of the solid state amplifier in FIG. 4.

FIG. 6 is a cross-sectional view along section 6—6 of FIG. 4 illustrating an exemplary technique for providing a positive and negative bias voltage to bias pads 28a and 28b of amplifier arrangement 19. As seen in FIG. 6, the input and output reduce-height waveguide sections 46 are shown at the top and bottom of FIG. 6 with amplifier means 19 mounted therebetween in cavity 48. To provide the appropriate biasing to the FET, milled channels 60 and 61 are provided and machined printed positive and negative bias lines 62 and 63, respectively, are formed therein. The bias lines 63 and 63 are formed in the channels to automatically place them in electrical contact with bias pads 28b and 28a, respectively, when amplifier arrangement 19 is mounted within grooves 50 in the arrangement of FIG. 5. More particularly, wall 51 does not come into contact with bias pads 28a and 28b due to the machining of channels 61 and 60, respectively. It is to be understood that bias lines 62 and 63 are formed within channels 60 and 61 in a manner to ensure insulation from electrical contact with waveguide walls 49 or 51.

FIG. 7 illustrates a cross-sectional view in perspective of an extension of the present invention, as shown in FIGS. 4–6, for serially coupling multiple amplifier arrangements 19 in each section of waveguide array 10. In the exemplary arrangement of FIG. 7, the input signal propagates along parallel-walled waveguide section 44 of input waveguide section 41 and is wideband impedance matched to a first amplifier arrangement 19a via steps 45 as explained heretofore for the arrangement of FIG. 4. The output from first amplifier arrangement 19a enters a first end, with a shorting section 47, of a first reduced-height intermediate waveguide section 70. A second amplifier arrangement 19b intercepts the output signal from first amplifier arrangement 19a at the second end of first intermediate waveguide section 70, which also includes a shorting section 47 to avoid deleterious effects from reflected waves.

The output from second amplifier means 19b is radiated into a second intermediate reduced-height waveguide section 71 at a first end thereof for propagation to a third amplifier arrangement 19c at a second end of second intermediate waveguide section 71. Again shorting sections 47 are disposed at each end of second intermediate waveguide section 71. The output from third amplifier arrangement 19c is radiated into the output waveguide section 42 for propagation and transmission in the manner described previously for output waveguide section 42 of FIG. 4. It is to be understood that first and second intermediate waveguide sections 70 and 71, being reduced-height waveguide sections, function as a filter for low-frequency signals and cut off any feedback of such signals, which can cause undesired oscillations in multistage amplifiers, especially at millimeter wavelengths.

It is to be understood that the above-described embodiments are simply illustrative of the principles of the present invention. Various other modifications and changes may be made by those skilled in the art which will embody the principles of the invention and fall within the spirit and scope thereof. For example, arrangements similar to FIG. 7 can be used to serially connect two or more amplifier arrangements 19 in each section of the amplifier array 10 to achieve a predetermined amount of amplification. More particularly, the present invention permits a feed source to transmit a low-power signal which is uniformly distributed to a large plurality of amplifier means formed in an array without the need for a dividing network to permit the transmitting of a beam which includes that signal at a high-power level.

What is claimed is:

1. An arrangement for high-power amplifying a signal, the arrangement comprising:
   an antenna arrangement including:
   an antenna feed arrangement comprising a predetermined aperture and capable of transmitting or receiving a signal; and
   a main reflector comprising a predetermined aperture capable of bidirectionally reflecting a signal between the predetermined aperture of the antenna feed arrangement and the predetermined aperture of the main reflector; and
   an amplifier array disposed at the predetermined aperture of the main reflector with at least a predetermined axis of said array disposed at an image surface of the aperture of the antenna feed arrangement, the array covering substantially the entire image of the aperture of the feed arrangement, the amplifier array comprising:
   a plurality of parallel mounted corresponding waveguide sections, each waveguide section of the array including (a) a solid state amplifier arrangement, (b) a first waveguide subsection for directing a signal received at an aperture thereof to an input of the solid state amplifier arrangement, and (c) a second waveguide subsection for directing an amplified signal at the output of the solid state amplifier arrangement to an aperture of the second waveguide subsection for transmission from the amplifier array, each of the first and second waveguide subsections including means for providing an impedance match between the aperture thereof and the solid state amplifier arrangement.

2. An arrangement for high-power amplifying a signal according to claim 1 wherein
   the solid state amplifier arrangement comprises one solid state amplifier including an input probe disposed in the first waveguide subsection and an output probe disposed in the second waveguide subsection.

3. An arrangement for high-power amplifying a signal according to claim 1 wherein
   the solid state amplifier arrangement comprises a plurality of N separate serially disposed solid state amplifiers, the first amplifier being disposed to receive the input signal from the first waveguide subsection and the last amplifier being disposed to transmit its output signal in the second waveguide subsection; and
   each waveguide section further comprises a plurality of N−1 intermediate waveguide subsections, each intermediate waveguide subsection being disposed to receive the output signal from a separate one of the plurality of N amplifiers and direct said output signal to an input of the next one of the serially disposed N amplifiers.

4. An arrangement for high-power amplifying a signal according to claim 2 or 3 wherein
   each solid state amplifier is disposed in a separate cavity between a separate reduced-height waveguide portion of sequential waveguide subsections forming each waveguide section of the array.

5. An arrangement for high-power amplifying a signal according to claim 1, 2 or 3 wherein
   the means for providing an impedance match between the aperture of the first and second waveguide subsection and an associated solid state amplifier arrangement comprises steps within the waveguide subsection for sequentially reducing the height of the waveguide subsection by predetermined amounts in a direction away from the aperture of the waveguide section.

6. An arrangement for high-power amplifying a signal according to claim 1, 2 or 3 wherein
   each waveguide subsection comprises means for introducing appropriate biasing to the solid state amplifier arrangement to provide a predetermined amount of amplification to a received signal propagating therethrough.

7. An arrangement for high-power amplifying a signal according to claim 1, 2, or 3 wherein
   the antenna feed arrangement comprises a single feedhorn whose aperture forms the entire predetermined aperture of the antenna feed arrangement and is capable of transmitting or receiving the signal.

8. An arrangement for high-power amplifying a signal according to claim 1, 2 or 3 wherein
   the antenna feed arrangement comprises a plurality of feedhorns formed in a feed array which include a combined aperture which forms the entire predetermined aperture of the antenna feed arrangement, and a subreflector disposed to reflect a wavefront between the feed array and the main reflector.

9. An arrangement for high-power amplifying a signal according to claim 1, 2 or 3 wherein
   the amplifier array is disposed at a predetermined angle to a beam radiated from the main reflector.

* * * * *